(12) United States Patent
Araki et al.

(10) Patent No.: US 11,163,974 B2
(45) Date of Patent: Nov. 2, 2021

(54) IMAGE ACQUISITION SYSTEM AND IMAGE ACQUISITION METHOD

(71) Applicant: HITACHI, LTD., Tokyo (JP)

(72) Inventors: Ryoko Araki, Tokyo (JP); Teruo Kohashi, Tokyo (JP); Jun Xie, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/086,608

(22) Filed: Nov. 2, 2020

(65) Prior Publication Data

US 2021/0192178 A1  Jun. 24, 2021

(30) Foreign Application Priority Data

Dec. 24, 2019 (JP) .............................. JP2019-232487

(51) Int. Cl.
*G06K 9/00* (2006.01)
*G01R 33/09* (2006.01)

(52) U.S. Cl.
CPC ......... *G06K 9/00134* (2013.01); *G01R 33/09* (2013.01); *G06K 9/00147* (2013.01)

(58) Field of Classification Search
CPC .......... G06K 9/00134; G06K 9/00147; G06K 2009/363; G06K 2209/40; G06K 9/00973; G06K 19/022; G06K 11/00; G06K 13/0825; G06K 19/04; G06K 9/20; G06K 9/28; G06K 9/32; G06K 9/46; G06K 9/56; G06K 9/60; G06K 9/6203; G06K 9/6247; G06K 9/6262; G06K 19/0723; G01R 33/09; G01R 33/0325;
G01R 33/1292; G01R 33/565; G01R 33/56536; G01R 33/5608; G01R 33/34; G01R 33/3873; G01R 33/4828; G01R 33/56563; G01R 33/288; G01R 33/385; G01R 33/3875; G01R 33/48;
(Continued)

(56) References Cited

U.S. PATENT DOCUMENTS

2013/0279309 A1* 10/2013 Matsuzaki ............... G11B 5/62
369/13.01
2014/0150555 A1* 6/2014 Ikushima ............. G01N 27/725
73/596

(Continued)

FOREIGN PATENT DOCUMENTS

JP 2002-156361 A 5/2002

*Primary Examiner* — Nimesh Patel
(74) *Attorney, Agent, or Firm* — Volpe Koenig (57) ABSTRACT

In an image acquisition system, a distortion distribution is easily measured in a wide range. A standard image of magnetic domain of a sample serving as a standard is acquired by radiation of light using a standard external magnetic field which serves as a standard, a plurality of magnetic domain images are acquired in a state where an external magnetic field is applied while being changed, a plurality of subtraction images obtained by subtracting the standard image of magnetic domain from each of the plurality of magnetic domain images are acquired, a magnetization reversal area in which a magnetic domain is reversed is extracted from each of the plurality of subtraction images, and a composite image having a plurality of magnetization reversal areas is acquired by compositing the plurality of subtraction images each having the magnetization reversal area.

14 Claims, 11 Drawing Sheets

(58) Field of Classification Search
CPC .......................... G01R 33/3804; G01R 33/443; G01R 33/445; G01R 33/4625; G01R 33/4822; G01R 33/56; G01R 33/5616; G01R 33/56572; G01R 33/5659; G01R 33/1215; G01R 33/286; G01R 33/60; G01R 33/4808; G01R 33/381; G01R 33/383; G01R 33/5611; G01R 33/24; G03G 19/00; G03G 15/04045; G03G 15/14; G03G 17/00; G03G 5/16; G06F 3/046; H01J 2231/5001; H01J 2231/5056; H01J 29/39; H01J 29/45; H01J 31/40; H01J 31/50; H01J 31/52; H01J 29/76; H01J 29/705; H01J 2229/5682; H01J 29/701; G06N 5/02; G06N 20/00; G06N 20/10; G01N 24/081; G01N 27/725; G01N 29/043; G01N 29/2418; G01N 29/2431; G01N 29/346; G01N 29/14; G01N 29/2412; G01N 24/08; A61N 2005/1055; A61N 5/1049; A61N 5/1067; A61N 5/1039; A61N 5/1064; A61N 5/1045; G06T 7/0002; G06T 7/0014; G06T 7/30; G06T 2207/10088; G06T 2207/20084; G06T 5/002; G06T 7/0012; A61B 5/005; A61B 5/4836; A61B 5/0035; A61B 2090/374; A61B 2017/00911; A61B 2034/2051

See application file for complete search history.

(56) References Cited

U.S. PATENT DOCUMENTS

2019/0096957 A1\* 3/2019 Uchida .................. G01R 33/09
2020/0249288 A1\* 8/2020 Inami ..................... G01R 33/12

\* cited by examiner

41, 42 ▮▮▮ AREA WHERE MAGNETIZATION IS REVERSED BY LOW MAGNETIC FIELD

43 ▢ AREA WHERE MAGNETIZATION IS REVERSED BY MEDIUM MAGNETIC FIELD

45 ▨ AREA WHERE MAGNETIZATION IS REVERSED BY HIGH MAGNETIC FIELD

44 ▫ AREA WHERE MAGNETIZATION IS NOT REVERSED

IMAGE ACQUISITION SYSTEM AND IMAGE ACQUISITION METHOD

BACKGROUND OF THE INVENTION

1. Field of the Invention

The present invention relates to an image acquisition system and an image acquisition method.

2. Description of the Related Art

In recent years, there is an increasing need for energy saving to reduce environmental load. Along with this trend, electronic control components such as a motor, a solenoid, and a transformer are desired to have higher performance, higher control, higher efficiency, and lower power consumption. These components mainly include an electric wire and an iron core, and convert electrical energy and magnetic energy. Here, efficient energy conversion is the most important in an energy saving measure.

For the iron core, a soft magnetic material is mainly used, and electromagnetic steel is generally used. When stress or distortion is applied to the electromagnetic steel or the soft magnetic material, material strength and magnetic properties change. In general, the stress or the distortion causes material embrittlement or the like, which causes damage. Non-uniform magnetic properties in a sample hinder improvement of properties.

However, in some electromagnetic steels, performance can be improved by effectively controlling the distortion. It is known that, in a magnetic material, magnetic properties change significantly due to a shape and a size of a grain, a grain boundary dispersion, and a grain boundary shape between a grain and a grain.

Therefore, there is a need for a method that can easily determine a presence or absence of distortion and evaluate an area affected by the distortion, and further clarify a cause of the distortion. At the same time, there is also a need for a method that can evaluate a grain shape, a grain size, grain boundary dispersion, or the like.

In the related art, as a method used for stress distortion evaluation, there is a method of measuring a change in a lattice constant by a method using an X-ray, a transmission electron microscope (TEM), an electron backscatter diffraction (EBSD), or the like. As grain boundary analysis, there is a method using a backscattered electron (BSE) image. For example, JP-A-2002-156361 (Patent Literature 1) discloses a technique for estimating magnetic permeability based on a known material.

In the related art, in measurement using an X-ray used in stress distortion evaluation, since only an average distortion value of an entire sample piece is known, a place where distortion is present cannot be specified. In addition, distortion measurement by a TEM is an evaluation on an order of nm, and it is difficult to measure a sample in a wide range.

Similarly, since a surface is required to be smoothed even in distortion measurement by EBSD, it is necessary to process the surface of a sample for observation. Therefore, it is difficult to analyze a cause of the distortion, and a frequency of the distortion and the cause of the distortion cannot be clarified.

Further, in order to analyze a grain boundary from a BSE image, it is necessary to put the sample in a vacuum, and a shape of the sample is limited.

According to a method disclosed in Patent Literature 1, a magnetic permeability can be estimated based on a known material, but a distortion distribution state cannot be grasped. Therefore, it is desired to easily measure a distortion distribution in a wide range.

SUMMARY OF THE INVENTION

An object of the invention is to easily measure the distortion distribution in the wide range in an image acquisition system.

An image acquisition system according to an aspect of the invention includes a signal processing unit and acquires an image of a sample containing a magnetic material. The signal processing unit is configured to acquire a standard image of magnetic domain of the sample serving as a standard by radiation of light using a standard external magnetic field which serves as a standard, acquire a plurality of magnetic domain images in a state where an external magnetic field is applied while being changed, acquire a plurality of subtraction images obtained by subtracting the standard image of magnetic domain from each of the plurality of magnetic domain images, extract a magnetization reversal area in which magnetization is reversed from each of the plurality of subtraction images, and acquire a composite image having a plurality of magnetization reversal areas by compositing the plurality of subtraction images each having the magnetization reversal area.

An image acquisition method according to an aspect of the invention acquires an image of a sample containing a magnetic material. The image acquisition method includes: a step of acquiring a standard image of magnetic domain of the sample serving as a standard by radiation of light using a standard external magnetic field which serves as a standard; a step of acquiring a plurality of magnetic domain images in a state where an external magnetic field is applied while being changed; a step of acquiring a plurality of subtraction images obtained by subtracting the standard image of magnetic domain from each of the plurality of magnetic domain images; a step of extracting a magnetization reversal area in which magnetization is reversed from each of the plurality of subtraction images; and a step of acquiring a composite image having a plurality of magnetization reversal areas by compositing the plurality of subtraction images each having the magnetization reversal area.

According to an aspect of the invention, it is possible to easily measure a distortion distribution in a wide range in an image acquisition system.

DESCRIPTION OF EMBODIMENTS

Hereinafter, embodiments will be described with reference to the drawings.

First Embodiment

Figure 1:
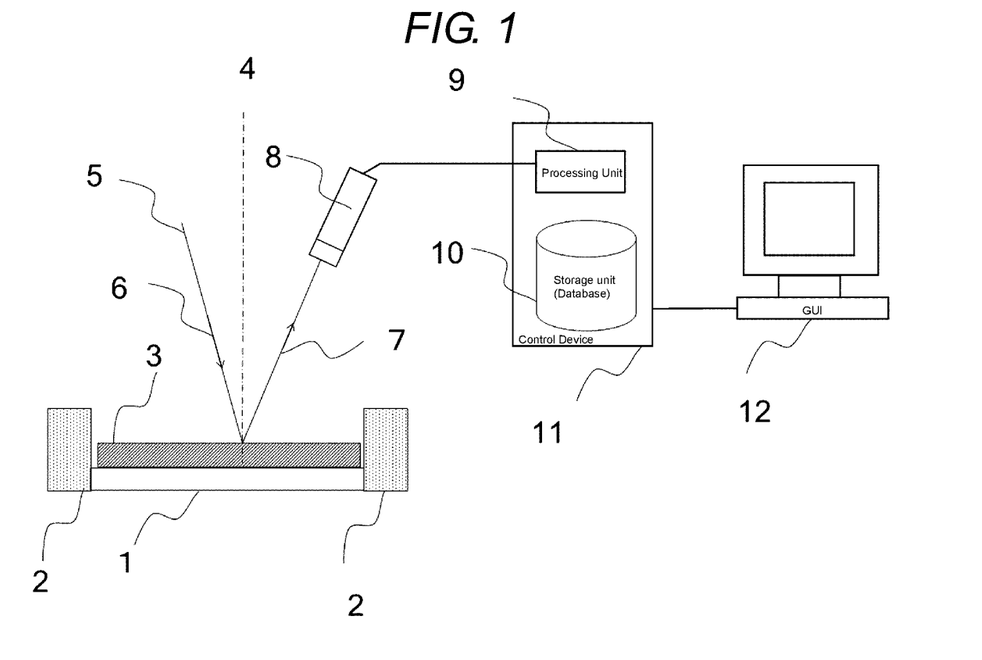
FIG. 1 is a diagram showing a configuration of an image acquisition system according to a first embodiment.

A configuration of an image acquisition system according to a first embodiment will be described with reference to FIG. 1.

The image acquisition system includes a stage mechanism system, an optical system, and an image processing system.

The stage mechanism system includes a sample holder 1 including a stage that fixes a sample 3 formed of a magnetic material and is movable in XYZ axes, and electromagnetic coils 2 that can apply an external magnetic field. The optical system includes a detector 8. The image processing system includes a control device 11 and an image display terminal (GUI) 12. The control device 11 includes a signal processing unit 9 and a storage unit (database) 10.

Laser light 5 is incident on a plane of the sample 3 as incident light 6, and reflected light 7 reflected by the plane of the sample 3 is detected by the detector 8. Here, reference numeral 4 indicates a sample normal direction. A detection signal detected by the detector 8 is sent to the signal processing unit 9 to perform a predetermined process.

An image acquisition method according to the first embodiment will be described with reference to FIG. 2.

First, the sample 3 is fixed on the sample holder 1, and a surface shape of the sample 3 placed on the sample holder 1 is observed to acquire a shape image (S101). At this time point, no external magnetic field is applied. That is, a light microscopic image is acquired without application of a magnetic field. The shape image can also be imaged using an optical microscope or the like.

Next, in the same field of view, a magnetic domain image, serving as a standard, of the sample 3 is acquired by radiation of light of a predetermined intensity (S102). At this time point, no external magnetic field is applied. That is, the magnetic domain image is acquired without application of the magnetic field.

The light used here is visible light, ultraviolet light, or the like. A fact that light is incident on the plane of the sample 3 formed of the magnetic material and a polarization plane of the reflected light 7 rotates is called Kerr effect. In a Kerr microscope, a direction of magnetization of the sample 3 is detected using the Kerr effect, and the magnetic domain image is acquired. The magnetic domain image is obtained by using a longitudinal Kerr effect or a transverse Kerr effect when the magnetization of the sample 3 is directed in an in-plane direction and using a polar Kerr effect when the magnetization of the sample 3 is directed in a direction perpendicular to a sample surface.

In order to use the longitudinal Kerr effect or the transverse Kerr effect, the incident light 6 is incident at an angle of 45 degrees with respect to the sample normal direction 4. In order to use the polar Kerr effect, incident light is incident from the sample normal direction 4 of the sample 3. Further, by shifting a polarizer and an analyzer of the Kerr microscope by about 3 to 5 degrees, a magnetic domain contrast is formed and the magnetic domain image can be obtained. Here, the magnetic domain image is acquired by using the Kerr microscope, but the magnetic domain image may be acquired by using other devices. For example, the magnetic domain image may be acquired by using a magnetic force microscope (MFM) or a scanning electron microscope (SEM).

Next, the magnetic domain image is acquired in a state where the external magnetic field is applied by the electromagnetic coils 2 installed at both ends of the sample 3 (S103).

Next, a subtraction image is acquired by subtracting a standard image of magnetic domain from the magnetic domain image obtained by applying the external magnetic field (S104). An area in which magnetization is reversed is extracted from the obtained subtraction image to specify a magnetization reversal area (S105).

By repeating the above steps (S101 to S105), the subtraction image in which the external magnetic field is changed is acquired, and the magnetization reversal area in which the magnetization is reversed is extracted from the subtraction image and integrated and combined into one image. In this way, a composite image which is a mapping image of the magnetization reversal area is acquired.

In this case, an area in which the magnetization is not reversed can be determined as a non-magnetic area, for example, a grain boundary area, a grain boundary image can be formed, and a grain boundary distribution can be analyzed, which is effective for material analysis similarly to a mapping image of a distortion distribution. The acquired images are all stored in a database which is a storage unit 10.

Next, a distortion amount of each magnetization reversal area is calculated (S106).

Next, a distortion distribution image is produced and acquired by associating the magnetization reversal area with the distortion amount in the mapping image (composite image) (S107).

Finally, the distortion distribution image is used to investigate a cause of the distortion (S108).

An acquisition method of the subtraction image will be described with reference to FIGS. 3A to 3C.

Figure 3A:
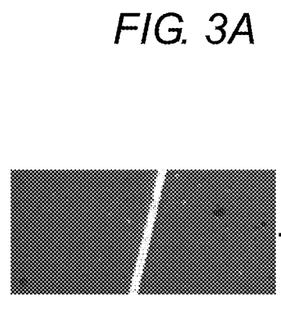
FIGS. 3A to 3C are explanatory diagrams showing an example of a method of acquiring a subtraction image.
Figure 3B:
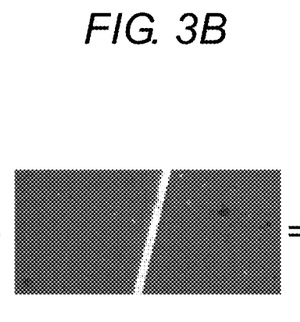
Figure 3C:
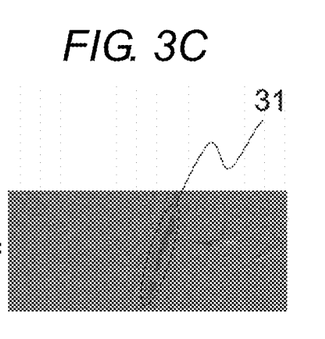

FIG. 3A is the magnetic domain image obtained by applying a predetermined external magnetic field. FIG. 3B is the standard image of magnetic domain (without application of a magnetic field) before applying the magnetic field in the same field of view. FIG. 3C is an image obtained by subtracting the image in FIG. 3B from the image in FIG. 3A. By applying the predetermined external magnetic field, contrast of an area in which the magnetization is reversed changes, and a magnetization reversal area 31 can be extracted.

Next, FIGS. 4A to 4D show subtraction images obtained by subtracting the standard image of magnetic domain from the magnetic domain image obtained by applying while changing the external magnetic field.

Figure 4A:
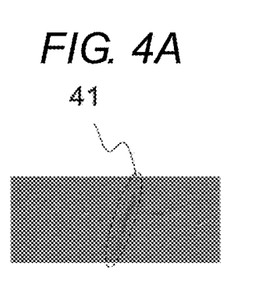
FIGS. 4A to 4D are explanatory diagrams showing an example of subtraction images.
Figure 4B:
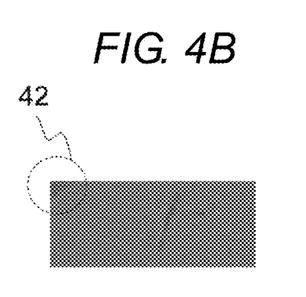
Figure 4C:
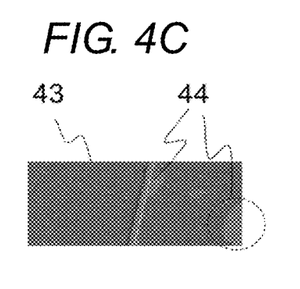
Figure 4D:
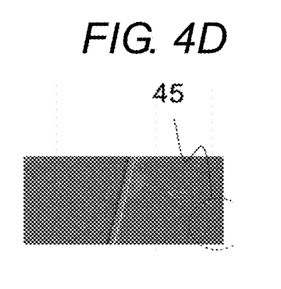

In the subtraction images in FIGS. 4A and 4B, low magnetic field reversal areas 41 and 42 are formed. In the subtraction image in FIG. 4C, a medium magnetic field reversal area 43 and an area 44 in which the magnetization is not reversed are formed. In the subtraction image in FIG. 4D, a high magnetic field reversal area 45 is formed.

By repeating the above steps (S101 to S105), it is possible to obtain the magnetic domain image in which the contrasts of various areas are changed according to the respective external magnetic fields.

Figure 5:
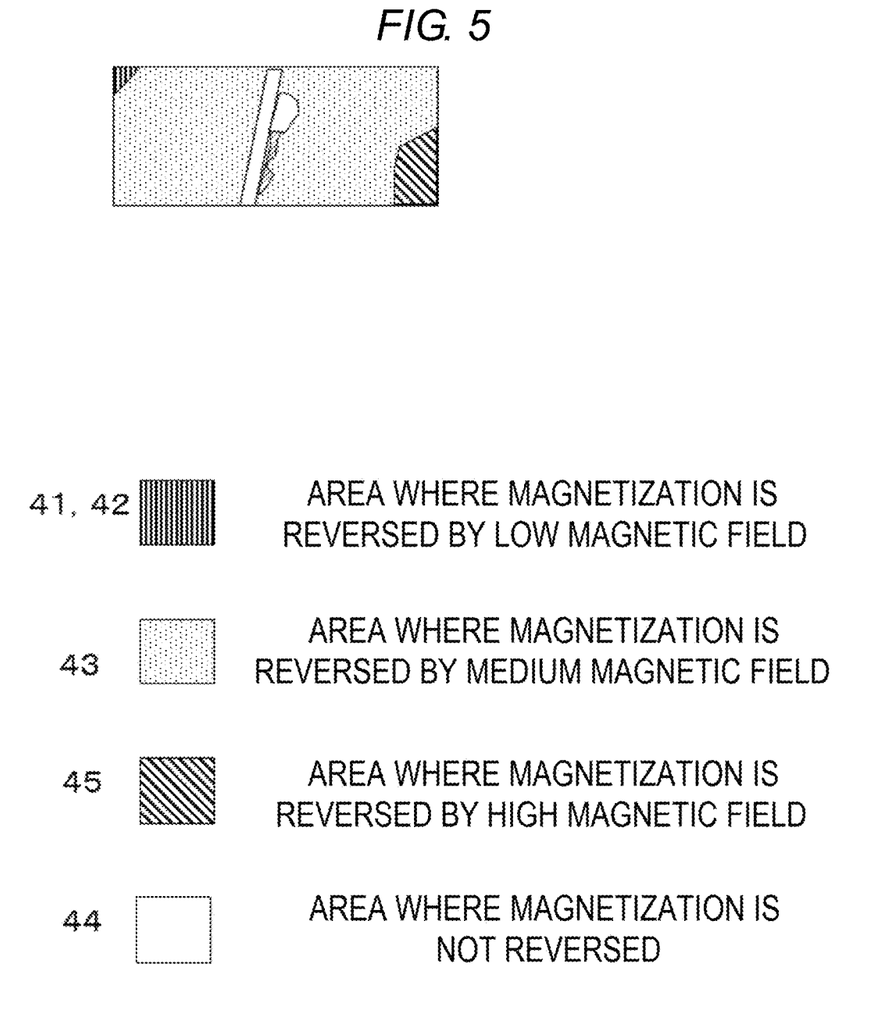
FIG. 5 is an explanatory diagram showing an example of a configuration of a mapping image of a magnetization reversal area.

FIG. 5 shows a mapping image (composite image) of the magnetization reversal area.

By combining the subtraction images (FIGS. 4A to 4D) obtained by subtracting the standard image of magnetic domain from the magnetic domain image obtained by applying while changing the external magnetic field and shown in FIGS. 4A to 4D, the composite image having a plurality of magnetization reversal areas is acquired. Thus, in the composite image, the low magnetic field reversal areas 41 and 42 in which the magnetization is reversed by a low magnetic field, the medium magnetic field reversal area 43 in which the magnetization is reversed by a medium magnetic field, the area 44 in which the magnetization is not reversed, and the high magnetic field reversal area 45 in which the magnetization is reversed by a high magnetic field are formed. By extracting areas in which the magnetization is reversed and integrating the areas into one image, the mapping image of the reversal areas can be acquired.

Figure 6:
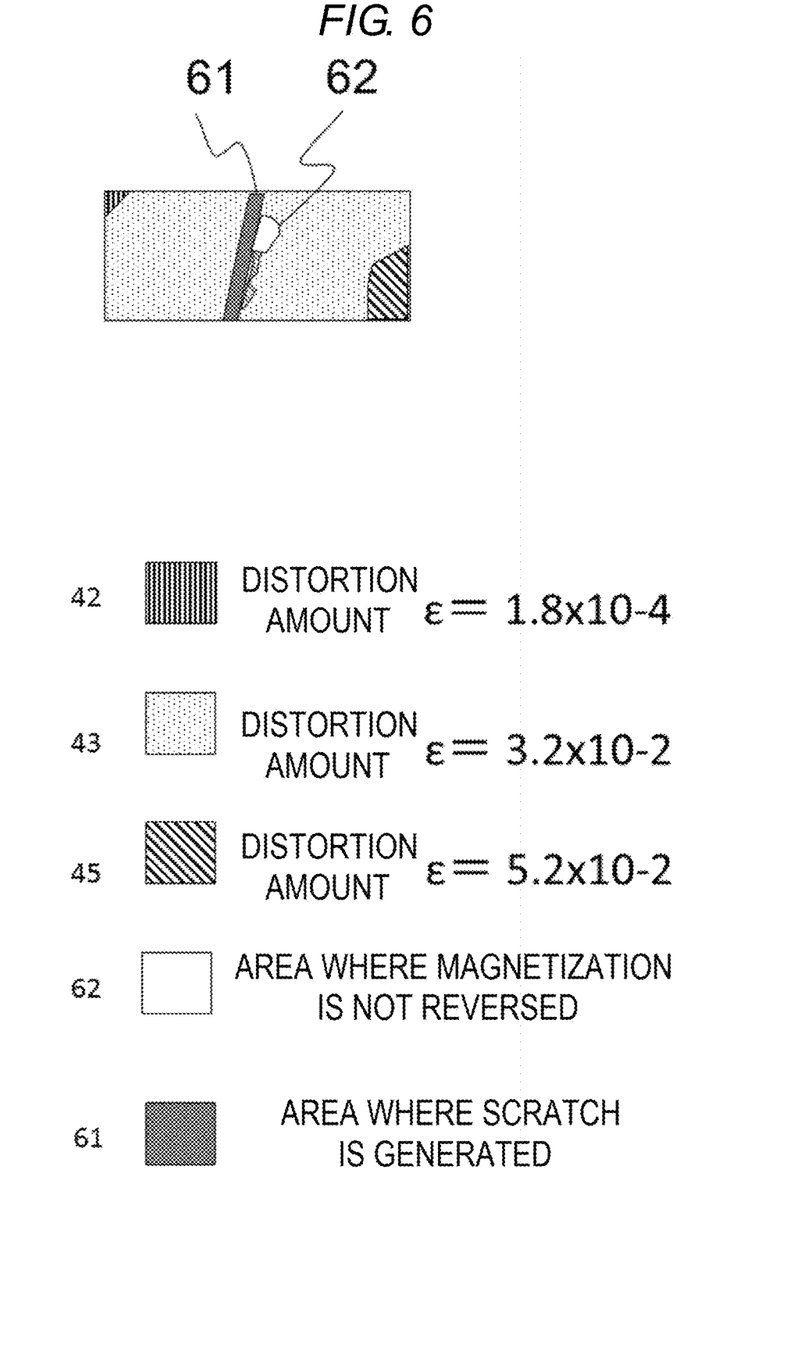
FIG. 6 is an explanatory diagram showing an example of a configuration of a distortion distribution diagram.

Next, as shown in FIG. 6, the distortion amounts of the plurality of magnetization reversal areas are calculated, and the distortion distribution image is acquired by associating the magnetization reversal area with the distortion amount in the composite image.

Here, in a case where the external magnetic field is $H_{inv}$, when the magnetization is reversed, an anisotropy constant $K_u$ at this time is represented by the following Expression 1.

$$K_u \propto H_{inv} \times I_s \quad I_s: \text{spontaneous magnetization} \quad \text{(Expression 1)}$$

From an expression of magnetic anisotropy energy, stress σ is expressed by the following Expression 2.

$$\sigma \propto K_u / \lambda \quad \lambda: \text{magnetostriction constant} \quad \text{(Expression 2)}$$

Figure 2:
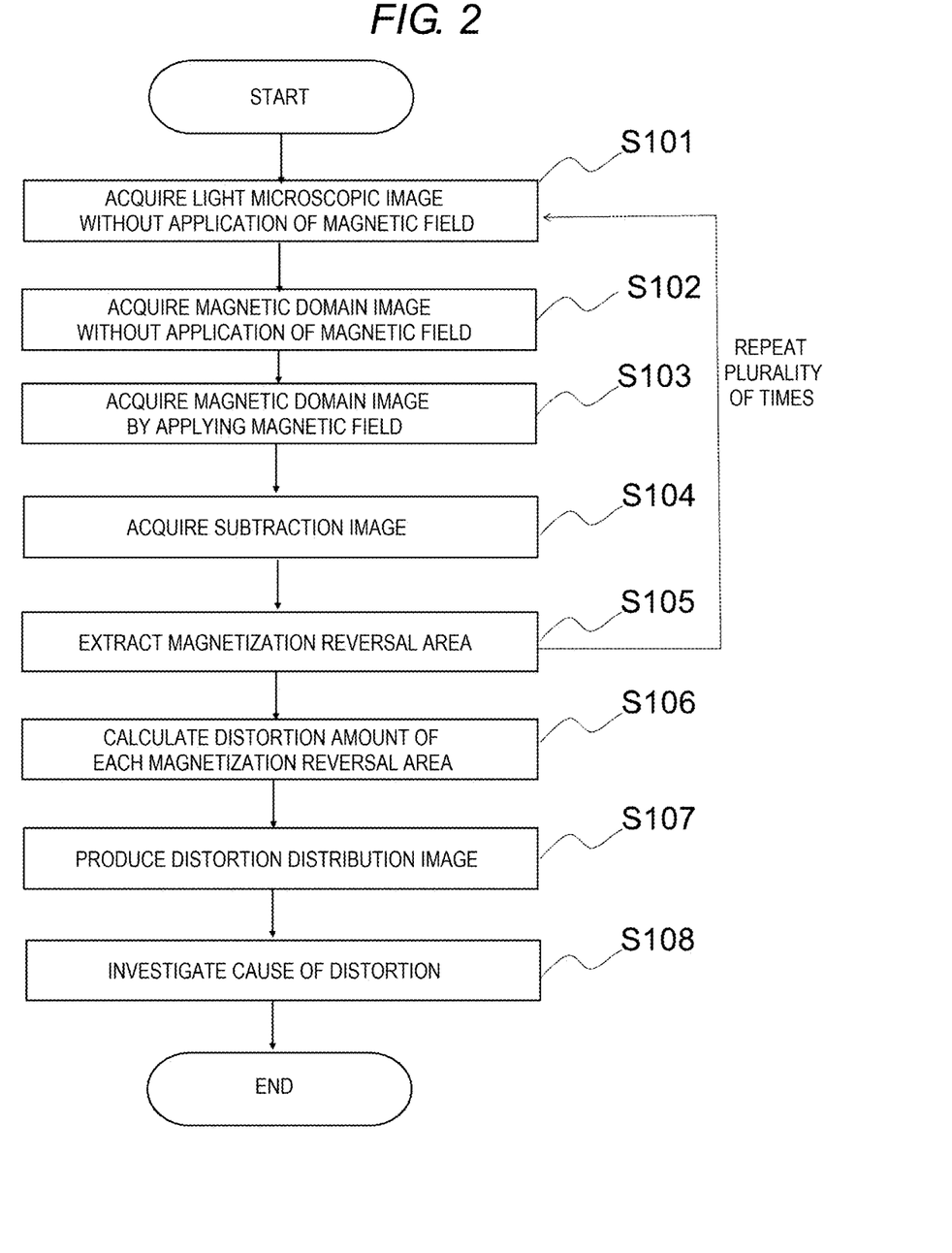
FIG. 2 is a flowchart showing an image acquisition method according to the first embodiment.

The distortion amount ε is calculated in S106 in FIG. 2 based on Expression 1, Expression 2, and a Young's modulus of each material.

Here, the distortion amount ε of the low magnetic field reversal areas 41 and 42 is $1.8 \times 10^{-4}$, the distortion amount ε of the medium magnetic field reversal area 43 is $3.2 \times 10^{-2}$, and the distortion amount ε of the high magnetic field reversal area 45 is $5.2 \times 10^{-2}$. Here, reference numeral 62 is the area in which the magnetization is not reversed.

Further, the obtained distortion distribution image is stored in the storage unit 10. As shown in FIG. 6, the distortion distribution image can be acquired by associating the distortion amount with the reversal area in the composite image.

Figure 7:
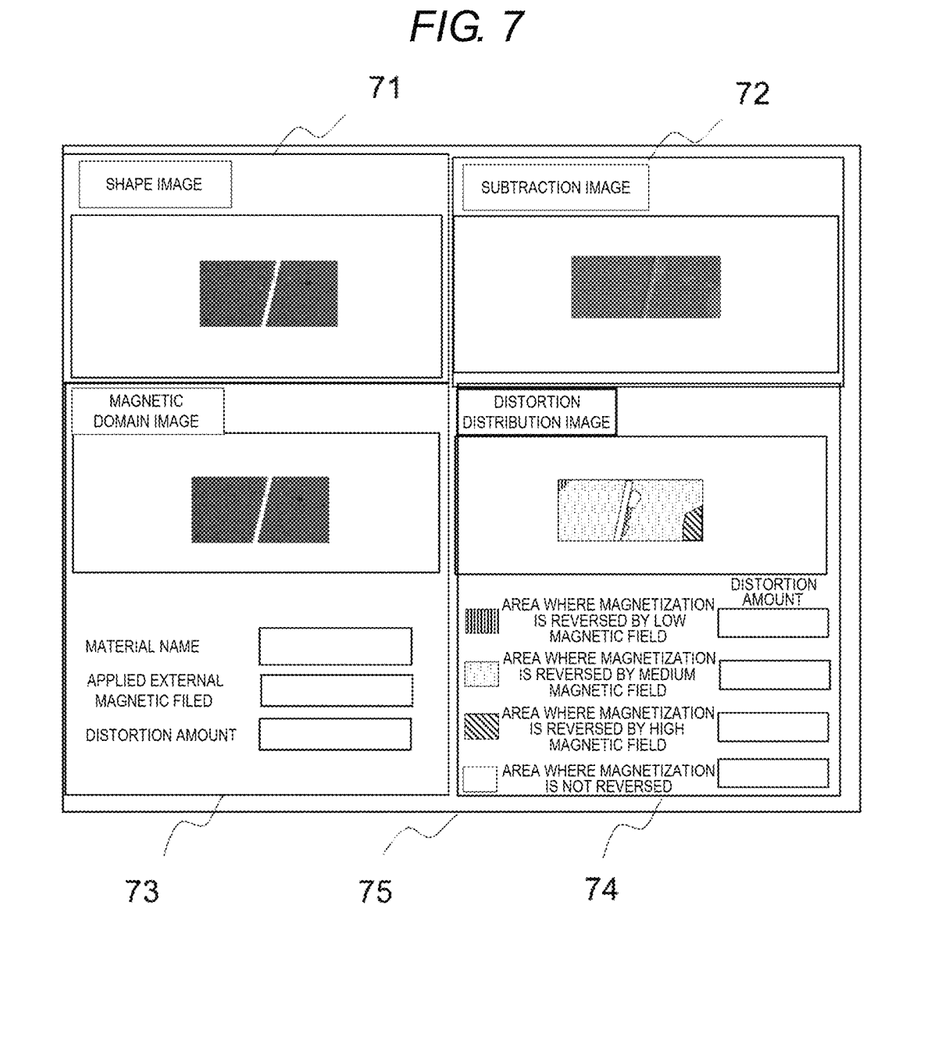
FIG. 7 is an explanatory diagram showing an example of an operation GUI according to the first embodiment.

Contents displayed on a screen of an image display terminal 12 will be described with reference to FIG. 7. FIG. 7 is an example of the operation GUI. Here, reference numerals 71, 72, 73, 74, and 75 are windows on the screen.

On the screen of the image display terminal 12, a shape image (shape image), a magnetic domain image (magnetic domain image), a subtraction image (subtraction image), and a distortion distribution image (distortion distribution image) which are stored in the storage unit 10 are collectively displayed. In this way, all the obtained images can be displayed on the operation GUI. That is, the obtained distortion distribution image and the obtained shape image can be simultaneously displayed on the GUI. This makes it easy to associate with a surface structure, so that the cause of the distortion can be easily estimated and clarified. As a result, reference numeral 61 in FIG. 6 can be determined to be an area in which a scratch is generated. Further, the obtained subtraction image, the obtained distortion distribution image, and the obtained shape image are all stored in the storage unit 10.

By using the screen on the image display terminal 12 for evaluation of a sample having magnetism, mapping and quantitative evaluation of the distortion distribution of the sample can be performed in a non-destructive manner. Therefore, the screen of the image display terminal 12 can also be used for quality control of the sample.

Second Embodiment

An image acquisition method according to a second embodiment will be described with reference to FIG. 8.

A difference from the image acquisition method of the first embodiment shown in FIG. 2 is that S102 in FIG. 2 is changed to S802. That is, in S102 in FIG. 2, a magnetic domain image which serves as a standard is acquired without application of a magnetic field, that is, with no external magnetic field applied, whereas in S802 in FIG. 8, a magnetic domain image which serves as a standard is acquired with the external magnetic field applied. The other steps (S101, S103, S104, S105, S106, and S107) are the same as those of the image acquisition method of the first embodiment shown in FIG. 2, and a description thereof is omitted.

Figure 8:
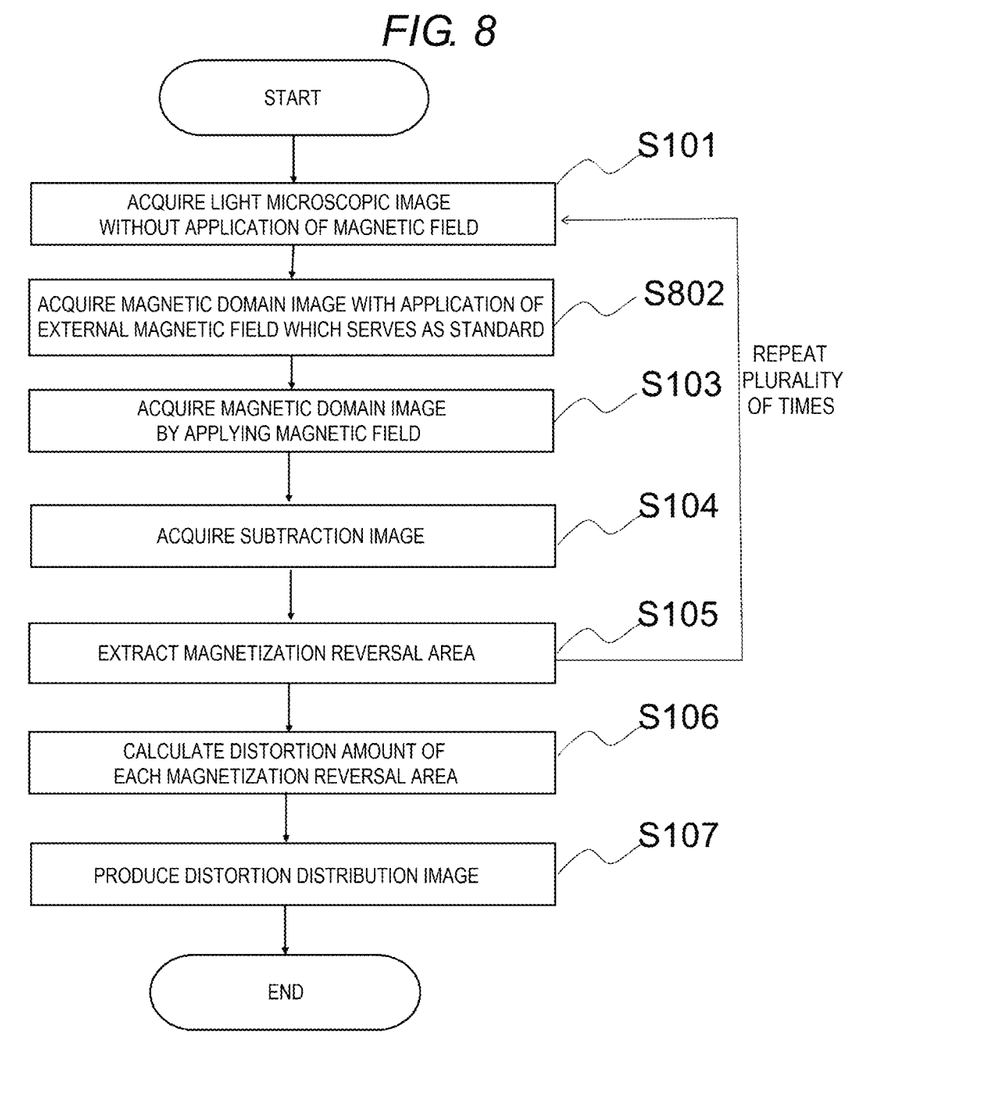
FIG. 8 is a flowchart showing an image acquisition method according to a second embodiment.

In the image acquisition method according to the second embodiment, as shown in FIG. 8, in obtaining the magnetic domain image which serves as a standard, the magnetic domain image is acquired in a certain desired magnetic field application state. For example, it is also effective to apply a high magnetic field at a level at which magnetization is completely saturated, and set an image in a single magnetic domain state as a standard image. After acquisition, imaging is repeated a plurality of times in the same procedure as in the first embodiment to acquire the magnetic domain image. Accordingly, a distortion distribution image can be acquired, and it is possible to easily estimate and clarify a cause of the distortion.

Third Embodiment

Figure 9:
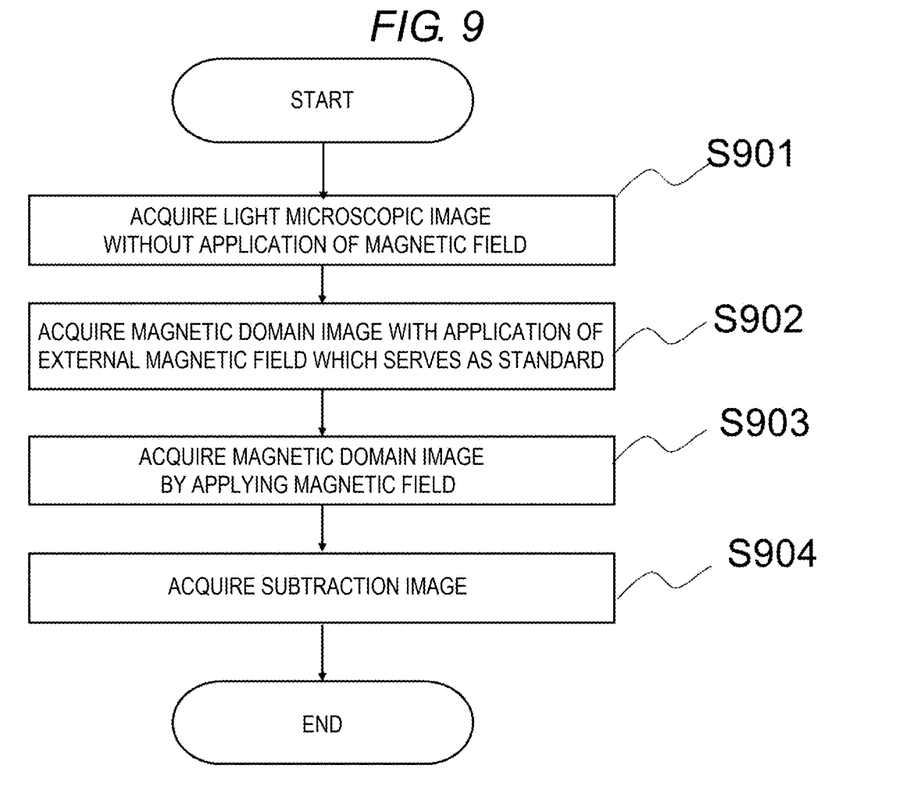
FIG. 9 is a flowchart showing an image acquisition method according to a third embodiment.

An image acquisition method according to a third embodiment will be described with reference to FIG. 9.

In the third embodiment, a grain boundary image is acquired in the same procedure as in the second embodiment shown in FIG. 8. That is, a magnetic domain image is acquired, a subtraction image with an image to which a predetermined external magnetic field is applied is acquired, and an image of a grain boundary area is acquired.

First, the sample 3 is fixed on the sample holder 1, and a surface shape of the sample 3 placed on the sample holder 1 is observed to acquire a shape image (S901). At this time point, no external magnetic field is applied. That is, a light microscopic image is acquired without application of a magnetic field.

Next, in the same field of view, the magnetic domain image is acquired with application of the external magnetic field which serves as a standard (S902).

Next, the magnetic domain image is acquired in a state where the external magnetic field is applied by the electromagnetic coils 2 installed at both ends of the sample 3 (S903).

Finally, a subtraction image is acquired by subtracting a standard image of magnetic domain from the magnetic domain image obtained by applying the external magnetic field (S904).

Figure 10A:
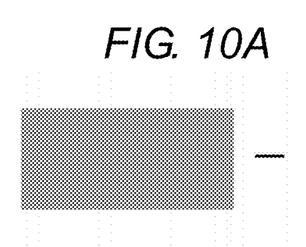
FIGS. 10A to 10C are explanatory diagrams showing an example of a method of acquiring a grain boundary from the subtraction image.
Figure 10B:
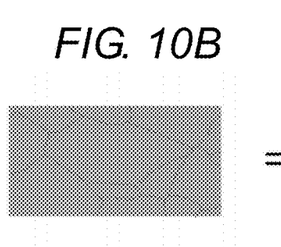
Figure 10C:
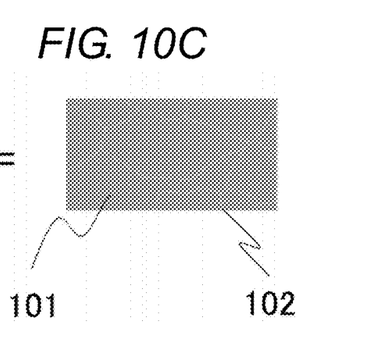

As shown in FIGS. 10A to 10C, when a grain boundary portion is formed of a non-magnetic material or a composition or structure different from that of an inside of a grain, a difference occurs in a contrast of a grain inner area and a contrast of the grain boundary portion. Here, reference numeral 101 is a grain, and reference numeral 102 is a grain boundary.

Figure 11:
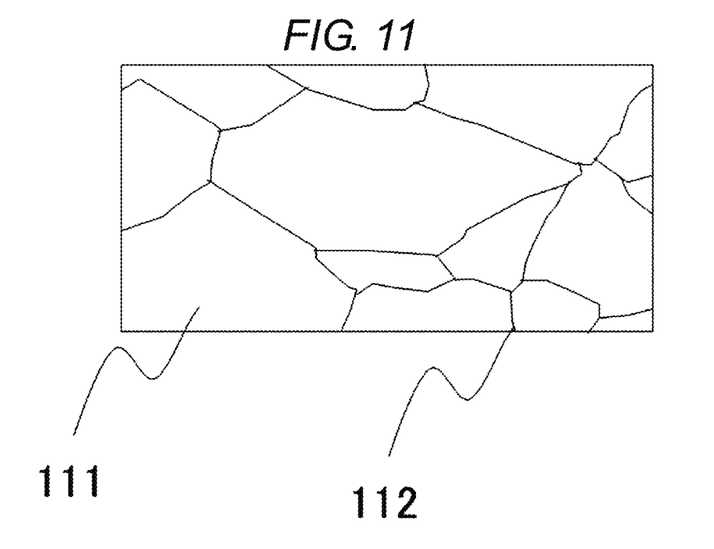
FIG. 11 is an explanatory diagram showing an example of a grain boundary image.

Therefore, by subtracting the image, a grain boundary area as shown in FIG. 11 can be extracted. By evaluating a plurality of images while shifting an observation position slightly, it is possible to evaluate a grain shape, a grain size, grain boundary distribution, or the like in a wide range. Here, reference numeral 111 is a grain, and reference numeral 112 is a grain boundary.

By combining data such as the obtained grain shape, grain size measurement, and grain boundary distribution with the distortion distribution image obtained in the first embodiment or the second embodiment, it is possible to easily estimate and clarify a cause of a distortion.

Figure 12:
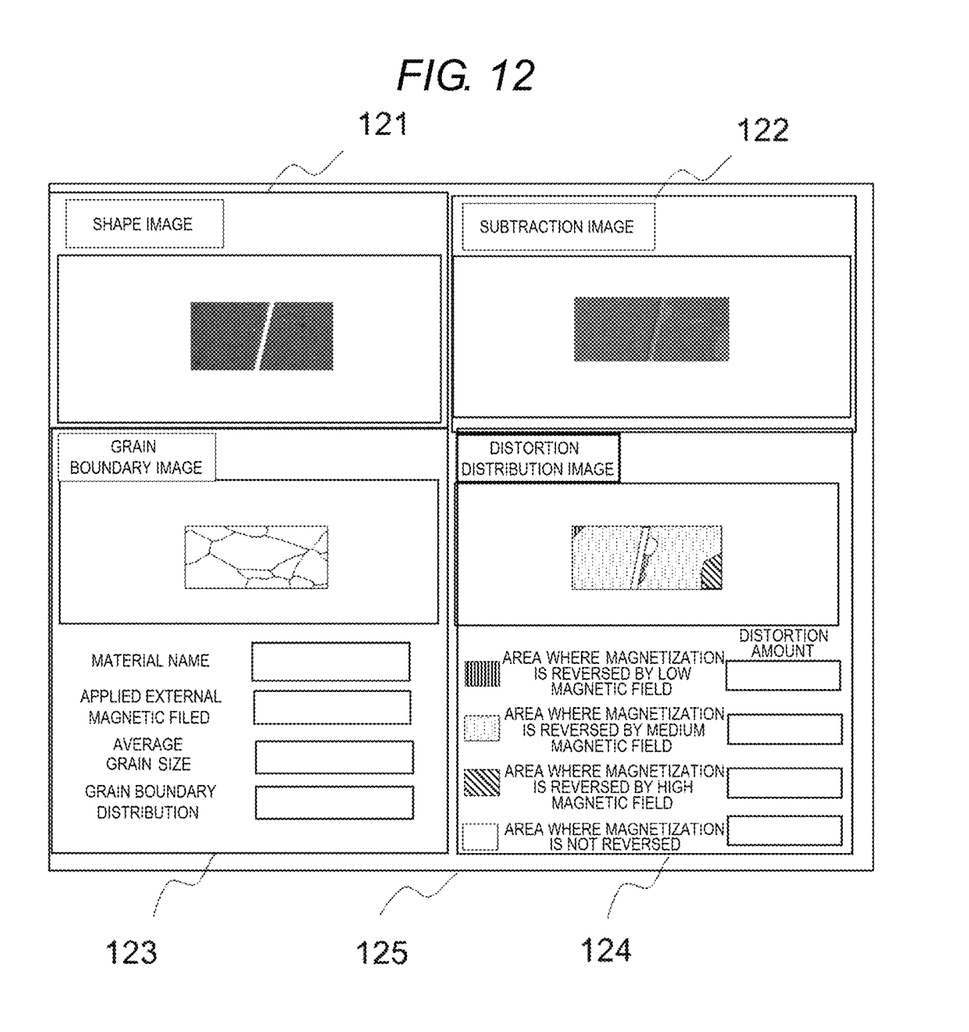
FIG. 12 is an explanatory diagram showing an example of an operation GUI according to the third embodiment.

FIG. 12 shows an example of an operation screen of the GUI in the third embodiment. Here, reference numerals 121, 122, 123, 124, and 125 are windows on the screen.

The obtained subtraction image (subtraction image), the obtained distortion distribution image (distortion distribution image), the obtained shape image (shape image), and the obtained grain boundary image (grain boundary image) can be simultaneously displayed on the GUI. By comparing respective images, it is possible to easily associate a surface structure or a grain structure. Therefore, it is possible to easily estimate and clarify the cause of the distortion.

Using the operation screen of the GUI, a sample having magnetism is evaluated. Accordingly, mapping and quantitative evaluation of the distortion distribution of the sample can be performed in a non-destructive manner. Therefore, the GUI operation screen can also be used for quality control of the sample.

In the above embodiment, by measuring a value of the external magnetic field whose magnetic domain contrast is reversed from magnetic domain observation, the distortion amount of the magnetic domain is estimated, and a distortion distribution image in the observation area is formed. Then, the distortion amount ($\varepsilon$) of the magnetic domain in a magnetic material is calculated, and the distortion distribution image in the observation area is obtained. That is, a magnetic domain change corresponding to the external magnetic field is extracted by a device having a method capable of imaging a magnetic domain structure in the same field of view as a surface shape image, and data with magnetization reversal due to the external magnetic field is also analyzed. Accordingly, the distortion amount is calculated, and the distortion distribution image is created and displayed simultaneously with the surface shape image.

According to the above embodiment, the distortion amount of the magnetic domain in the magnetic material is estimated, and the distortion distribution image in the observation area is obtained. In addition to simply obtaining the shape image by an optical microscope in the same field of view, the magnetization reversal by magnetic field application and the magnetic domain structure can also be observed at the same time. A sample state and a grain boundary position can be confirmed from the grain boundary image from the magnetic domain image or the subtraction image obtained in this way. As a result, it is possible to clarify the cause of the distortion. In addition, the sample can be easily evaluated a plurality of times in an atmosphere without contact or processing.

Since observation in a dynamic mode is possible, the distortion can be evaluated even in a component operation mode. Since the grain boundary position can be determined from the obtained subtraction image, grain boundary measurement and grain boundary distribution evaluation are also possible.

As described above, according to the above embodiment, the distortion distribution can be easily measured in a wide range in the image acquisition system.

What is claimed is:

1. An image acquisition system that acquires an image of a sample containing a magnetic material, the image acquisition system comprising:
   a processor configured with a signal processing function, wherein
   the processor configured with the signal processing function is configured to
      acquire a standard image of magnetic domain of the sample serving as a standard by radiation of light using a standard external magnetic field which serves as a standard,
      acquire a plurality of magnetic domain images in a state where an external magnetic field is applied while being changed,
      acquire a plurality of subtraction images obtained by subtracting the standard image of magnetic domain from each of the plurality of magnetic domain images,
      extract a magnetization reversal area in which magnetization is reversed from each of the plurality of subtraction images, and
      acquire a composite image having a plurality of magnetization reversal areas by compositing the plurality of subtraction images each having the magnetization reversal area; and
   an image display terminal configured to collectively display a shape image, a magnetic domain image, a subtraction image, and a distortion distribution image which are stored in a storage unit.

2. The image acquisition system according to claim 1, wherein
   the processor configured with the signal processing function is configured to
      calculate a distortion amount of each of the plurality of magnetization reversal areas, and
      acquire a distortion distribution image by associating the magnetization reversal area with the distortion amount in the composite image.

3. The image acquisition system according to claim 2, wherein
   the processor configured with the signal processing function is configured to
      extract, as the plurality of magnetization reversal areas, at least a first magnetization reversal area in which the magnetization is reversed by a first magnetic field, a second magnetization reversal area in which the magnetization is reversed by a second magnetic field higher than the first magnetic field, and a third magnetization reversal area in which the magnetization is reversed by a third magnetic field higher than the second magnetic field,
      calculate, as the distortion amounts of the plurality of magnetization reversal areas, at least a first distortion amount, a second distortion amount larger than the first distortion amount, and a third distortion amount larger than the second distortion amount, associate the first magnetization reversal area with the first distortion amount, associate the second magnetization reversal area with the second distortion amount, and associate the third magnetization reversal area with the third distortion amount.

4. The image acquisition system according to claim 1, wherein
the processor configured with the signal processing function is configured to acquire the standard image of magnetic domain in a magnetic field-free state where no external magnetic field is applied as the standard external magnetic field.

5. The image acquisition system according to claim 2, wherein
the processor configured with the signal processing function is configured to
acquire a shape image of a surface shape of the sample in the magnetic field-free state in a predetermined field of view, and
acquire the standard image of magnetic domain and the plurality of magnetic domain images in the predetermined field of view.

6. The image acquisition system according to claim 5, further comprising:
the storage unit configured to store predetermined information; and
the image display terminal configured to display a predetermined image, wherein
the storage unit is configured to store the shape image, the magnetic domain image, the subtraction image, and the distortion distribution image.

7. The image acquisition system according to claim 1, wherein
the processor configured with the signal processing function is configured to acquire the standard image of magnetic domain by irradiation of the light using any one of a Kerr microscope, a magnetic force microscope, and a scanning electron microscope.

8. The image acquisition system according to claim 5, wherein
the processor configured with the signal processing function is configured to acquire the shape image using an optical microscope.

9. The image acquisition system according to claim 1, further comprising:
a sample holder including a stage that fixes the sample and is movable; and
an electromagnetic coil configured to apply the external magnetic field.

10. The image acquisition system according to claim 1, further comprising:
an image display terminal configured to display at least a grain boundary image of the sample.

11. An image acquisition method that acquires an image of a sample containing a magnetic material, the image acquisition method comprising:
a processor configured with a signal processing function to perform:
a step of acquiring a standard image of magnetic domain of the sample serving as a standard by irradiation of light using a standard external magnetic field which serves as a standard;
a step of acquiring a plurality of magnetic domain images in a state where an external magnetic field is applied while being changed;
a step of acquiring a plurality of subtraction images obtained by subtracting the standard image of magnetic domain from each of the plurality of magnetic domain images;
a step of extracting a magnetization reversal area in which magnetization is reversed from each of the plurality of subtraction images;
a step of acquiring a composite image having a plurality of magnetization reversal areas by compositing the plurality of subtraction images each having the magnetization reversal area,
a step of storing a shape image, a magnetic domain image, a subtraction image, and a distortion distribution image; and
a step of collectively displaying the stored shape image, the stored magnetic domain image, the stored subtraction image, and the stored distortion distribution image.

12. The image acquisition method according to claim 11, further comprising:
a step of calculating distortion amounts of the plurality of magnetization reversal areas; and
a step of acquiring a distortion distribution image by associating the magnetization reversal area with the distortion amount in the composite image.

13. The image acquisition method according to claim 11, wherein
in the step of acquiring the standard image of magnetic domain, the standard image of magnetic domain is acquired in a magnetic field-free state where no external magnetic field is applied as the standard external magnetic field.

14. The image acquisition method according to claim 11, further comprising:
a step of displaying at least a grain boundary image of the sample.

* * * * *